US006411131B1

(12) United States Patent
Ang et al.

(10) Patent No.: US 6,411,131 B1
(45) Date of Patent: *Jun. 25, 2002

(54) METHOD FOR DIFFERENTIATING A DIFFERENTIAL VOLTAGE SIGNAL USING CURRENT BASED DIFFERENTIATION

(75) Inventors: Michael A. Ang, San Francisco; Jonathan E. Starr, Cupertino, both of CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/316,421

(22) Filed: May 21, 1999

Related U.S. Application Data

(63) Continuation-in-part of application No. 08/881,926, filed on Jun. 25, 1997, now Pat. No. 5,942,918.

(51) Int. Cl.[7] ............................. G01R 19/00; H03F 3/45
(52) U.S. Cl. ......................................... 327/52; 327/56
(58) Field of Search ........................... 327/51–57, 77, 327/89

(56) References Cited

U.S. PATENT DOCUMENTS

| | | | |
|---|---|---|---|
| 4,707,620 A | 11/1987 | Sullivan et al. ............... 326/86 |
| 4,719,369 A | 1/1988 | Asano et al. .................. 326/30 |
| 4,743,784 A | 5/1988 | Obara et al. ................... 327/57 |
| 4,804,871 A | 2/1989 | Walters, Jr. .................... 327/54 |
| 4,831,287 A | 5/1989 | Golab .......................... 327/55 |
| 4,845,675 A | 7/1989 | Krenik et al. ............... 365/203 |
| 4,855,628 A | 8/1989 | Jun .............................. 327/57 |
| 4,859,877 A | 8/1989 | Cooperman et al. .......... 326/30 |
| 4,959,563 A | 9/1990 | Schenck ....................... 326/27 |
| 5,134,311 A | 7/1992 | Biber et al. .................. 327/108 |
| 5,162,672 A | 11/1992 | McMahan et al. ............. 326/86 |
| 5,194,765 A | 3/1993 | Dunlop et al. ............... 327/112 |
| 5,371,420 A | 12/1994 | Nakao .......................... 326/27 |
| 5,457,407 A | 10/1995 | Shu et al. ...................... 326/30 |
| 5,594,696 A | * 1/1997 | Komarek et al. .............. 327/52 |
| 5,602,494 A | 2/1997 | Sundstrom .................... 326/39 |
| 5,615,161 A | 3/1997 | Mu ............................. 365/208 |
| 5,627,484 A | * 5/1997 | Tuminaro et al. .............. 327/56 |
| 5,644,252 A | 7/1997 | Watarai ........................ 326/27 |
| 5,657,456 A | 8/1997 | Gist et al. .................... 395/280 |
| 5,666,078 A | 9/1997 | Lamphier et al. ........... 327/108 |
| 5,726,583 A | 3/1998 | Kaplinsky .................... 326/30 |
| 5,808,487 A | * 9/1998 | Roy ............................. 327/55 |
| 5,852,529 A | 12/1998 | Arcoleo et al. ......... 365/189.05 |
| 5,977,798 A | * 11/1999 | Zerbe .......................... 326/98 |

FOREIGN PATENT DOCUMENTS

| | | |
|---|---|---|
| WO | WO 95/23472 | 8/1995 |
| WO | WO 98/40973 | 2/1998 |

* cited by examiner

*Primary Examiner*—Tuan T. Lam
(74) *Attorney, Agent, or Firm*—Skjerven Morrill LLP; Samuel G. Campbell, III

(57) ABSTRACT

A receiver is provided which quickly and efficiently recognizes signals by including with the receiver a resolving circuit which is coupled to a signal generation circuit which provides a differential current. The resolving circuit is coupled to a latching circuit. The resolving circuit can operate with supply voltage levels as low as one threshold voltage. Also, the signal setup and hold times are inherently vary small due to the high intrinsic bandwidth of the receiver. Other advantages include reduced power consumption, high speed operation, good rejection of input noise and power supply noise, ability to resolve small (e.g., 1.0 mVolt) voltage differences, reduced capacitive loading, and the ability to function with a variety of types of drivers, including HSTL, DTL and PECL.

16 Claims, 3 Drawing Sheets

METHOD FOR DIFFERENTIATING A DIFFERENTIAL VOLTAGE SIGNAL USING CURRENT BASED DIFFERENTIATION

CROSS-REFERENCE TO RELATED APPLICATIONS

This application is a continuation-in-part of U.S. patent application Ser. No. 08/881,926, now U.S. Pat. No. 5,942,918, filed on Jun. 25, 1997, entitled "Method for Resolving Differential Signals" and naming Michael A. Ang, Alexander D. Taylor, and Jonathan E. Starr as inventors, the application being incorporated herein by reference in its entirety.

This application relates to co-pending U.S. patent application Ser. No. 09/316,421, filed on even date herewith, entitled "Method for Differentiating a Differential Voltage Signal Using Current Based Differentiation" and naming Michael A. Ang and Jonathan E. Starr as inventors, the application being incorporated herein by reference in its entirety.

BACKGROUND OF THE INVENTION

1. Field of the Invention

The present invention relates to receivers and more particularly to differential receivers for use in information processing systems.

2. Description of the Related Art

In computer and information processing systems, various integrated circuit chips must communicate digitally with each other over common buses. The receiving bus nodes recognize the signal as being high or low using receivers, which are also referred to as input buffers. Often the receiver is a differential receiver, i.e. a receiver that detects the difference between two input signals, referred to as the differential inputs. These input signals may be a received signal and a reference voltage or they may be a received signal and the inverse of the received signal. In either case, it is the difference between the two input signals that the receiver detects in order to determine the state of the received signal.

Integrated circuits are powered at certain voltage levels, which levels are then provided to the various components, such as the receivers, which are located on the integrated circuit. However, the nominal supply voltage for integrated circuits keeps being decreased to reduce power consumption. Additionally, fluctuations of the voltage level during operation can make the voltage level powering a receiver even lower. The lower the supply voltage, the more challenging it is to get a receiver to operate reliably.

The signal frequency at which communication occurs can limit the performance of the overall system. Thus the higher the communication frequency, the better. The maximum frequency at which a system communicates is a function not only of the time that it takes for the electromagnetic wavefronts to propagate on the bus from one chip to another, but also of the time required for the signals to be reliably recognized at the receiving bus nodes as being high or low. Characteristics which affect the time in which a signal is recognized by a receiver include the set up time of the receiver, i.e., the amount of time before a clock edge that a signal must arrive and settle to a recognized level, and the hold time of the receiver, i.e., the time after a clock edge that the received signal must stay at a certain level in order for that level to be detected by the receiver. Other characteristics that affect the ability of the receiver to determine that state of the received signal include the ability of the receiver to reject input noise and power supply noise and the ability of the receiver to resolve small voltage differences between the differential inputs of the receiver.

It is desirable to provide a receiver which can receive signals provided by drivers of different types. Examples of types of drivers include High Speed Transmission Logic (HSTL) drivers, Dynamic Termination Logic (DTL) drivers, and Pseudo Emitter Coupled Logic (PECL) drivers.

SUMMARY OF THE INVENTION

It has been discovered that a receiver may be provided which quickly and efficiently recognizes signals by providing the receiver with a resolving circuit which is coupled to a differential current source which converts the signals to currents that produce differential voltages on first and second nodes, the difference in voltage being resolved by the resolving circuit. The differential source is in shunt (not in series) with the resolving circuit. The timing with which the differential source interacts with the resolving circuit is such that the signal to noise ratio is maximized.

Such a receiver advantageously operates with low power supply voltage levels, allows a small sampling window, i.e., a small sum of setup time requirement and hold time requirement, and quickly resolves a differential. Other advantages of the invention include reduced power consumption, high speed operation, good rejection of input noise and power supply noise, ability to resolve small (e.g., 1.0 millivolt) voltage differences, and the ability to function with a variety of types of drivers, including HSTL, DTL and PECL or any other driver type which uses a differential signal.

More specifically, in a preferred embodiment, the invention relates to a method for determining the value of a differential input value. The method includes: generating a first current based upon a first part of the differential input value, the first current generating a voltage at a first node; generating a second current based upon a second part of the differential input value, the second current generating a voltage at a second node; resolving which of the first and second nodes has a higher voltage based upon which of the first and second currents is higher reinforcing which of the first and second nodes has a higher voltage during the resolving step by amplifying a differential voltage imposed by the first and second currents at the first and second nodes, so as to enhance the resolving step; beginning reinforcing after the differential voltage is imposed by the first and second currents.

Additionally, in another preferred embodiment, the invention relates to a method for determining the value of a differential input value. The method includes the steps of providing a resolving circuit coupled to a clock signal, the resolving circuit having a first threshold voltage at a first and a second node below which a first portion of the resolving circuit turns on and a second threshold voltage at the first and second node above which a second portion of the resolving circuit turns on; coupling a first part of the differential input value to a first node; coupling a second part of the differential input value to a second node; using the clock signal to power the resolving circuit so as to allowing determining the value of the differential input value when the first or second node voltage exceeds the second threshold voltage of the resolving circuit; using the clock signal to turn on the second portion of the resolving circuit after the first portion of the resolving circuit is turned on.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
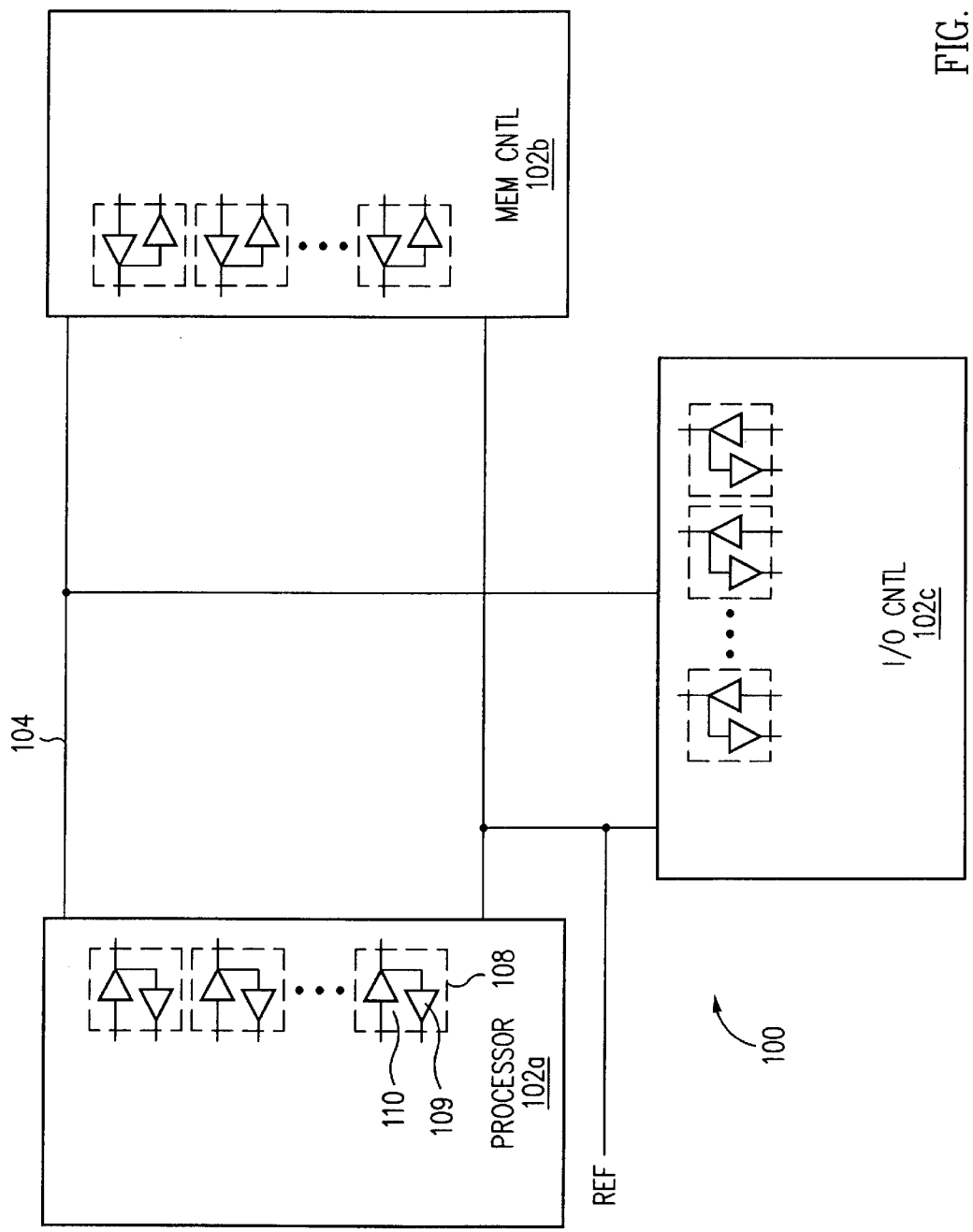
FIG. 1 shows a block diagram of an information handling system having a bus as well as receiver circuits in accordance with the present invention.

Referring to FIG. 1, information handling system 100 includes a plurality of components 102 such as processor 102a, memory controller 102b, and I/O controller 102c. It will be appreciated that these components 102 may be any type of component commonly found in an information handling system. Each of these components 102 is generally configured as an individual integrated circuit chip. However, it is known to combine various components into a single integrated circuit chip. Components 102 are coupled via bus 104. Bus 104 includes a plurality of parallel lines which are coupled to individual signal outputs and inputs of each of the components 102. It will be appreciated that receiver only and driver only circuits may also be included within component 102. Components 102 are also coupled to a common reference voltage (REF).

Each component 102 includes a plurality of input/output circuits 108 which are coupled to individual signal paths of bus 104. Each input/output circuit 108 includes a receiver circuit 109 and a driver circuit 110. Each receiver circuit 109 is also coupled to the common reference voltage.

In operation, receiver circuits 109 resolve differences in a differential input voltage while operating with a supply voltage as low as slightly more than a transistor threshold voltage, e.g., a voltage that is high enough to turn a transistor on. More specifically, each receiver circuit 109 includes a resolving circuit which is grounded by a clock input and which resolves the inputs of a differential input and provides this resolution to a latching circuit which latches the result and provides the result as a receiver output. Prior to latching the result, the receiver inputs are decoupled to facilitate resolving the inputs.

Figure 2:
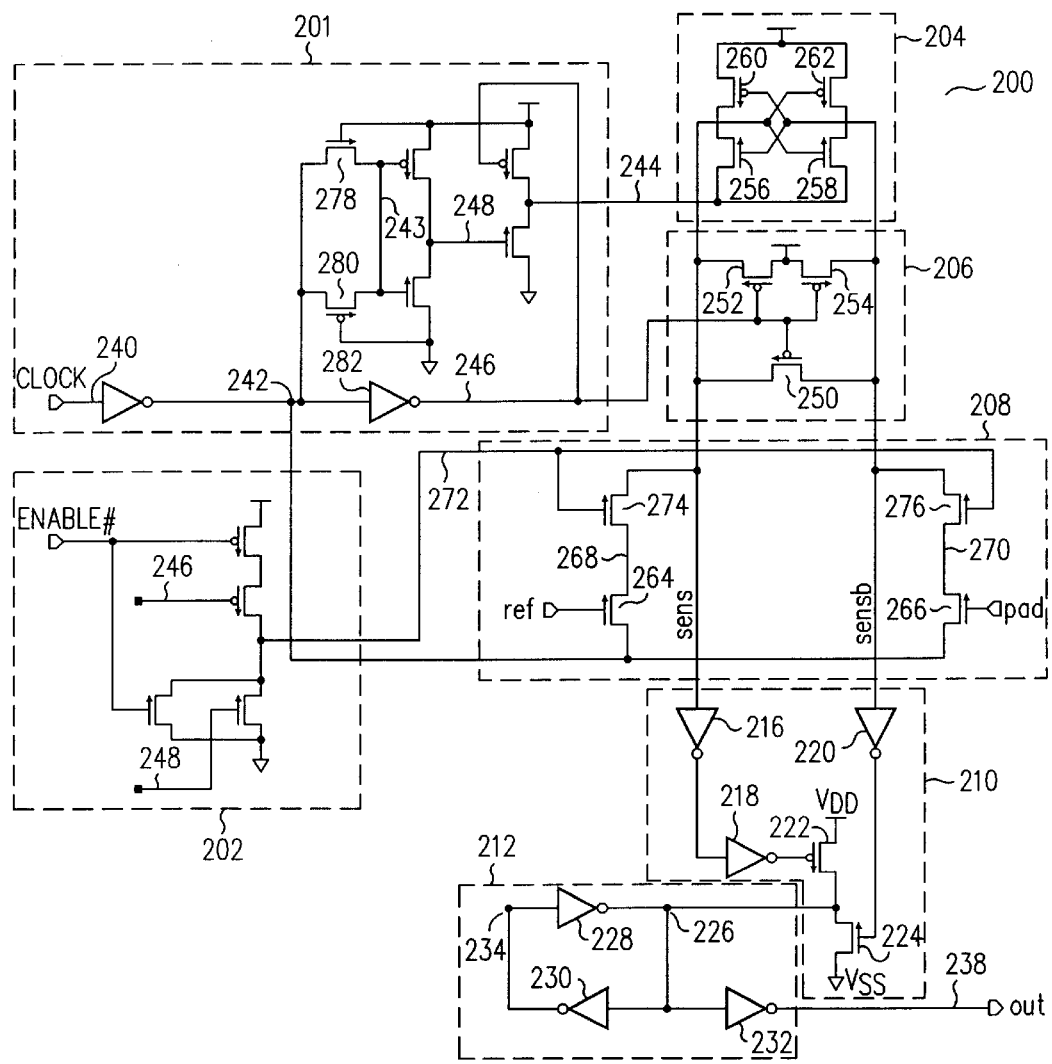
FIG. 2 shows a schematic diagram of a differential receiver of the information handling system of FIG. 1 in accordance with the present invention.

An embodiment of receiver 200 according to the present invention is shown in FIG. 2 including clock circuit 201, enable/disable circuit 202, resolving circuit 204, node equalization circuit 206, signal generating circuit 208, signal conversion circuit 210, and latching circuit 212. Nodes SENS and SENSB are coupled to latching circuit 212 through signal conversion circuit 210. In one embodiment, signal conversion circuit 210 is a CMOS pulsed-differential to single-ended signal conversion circuit including inverters 216, 218, 220, and transistors 222, 224. Signal conversion circuit 210 receives signals from nodes SENS and SENSB and converts them to a single output on node 226.

Latching circuit 212 includes inverters 228, 230, and 232 and maintains node signals 226 and 234 when signal conversion circuit 210 is not providing an output to node 226. Latching circuit 212 provides an output signal 238 to another circuit such as an integrated circuit chip (not shown). The combination of signal conversion circuit 210 and latching circuit 212 forms a set-reset (SR) latch-plus-driver circuit.

The operation of receiver 200 can be divided in two main sequential phases: a pre-charge phase and a signal differentiation phase.

In the pre-charge phase, clock input signal 240 is "low", which means that the voltage of signal 240 is at or very near the voltage at node VSS, and has been low long enough that nodes in the path of clock signal 240 are settled to a high or low state. Thus, when clock input signal 240 is low, node signals 242, 243 and 244 are high, and node signals 246 and 248 are low. With node 246 low, the PMOS transistors 250, 252, 254 are active, coupling nodes SENS and SENSB to each other and to VDD. Nodes SENS and SENSB are high because none of the other circuits connected to SENS and SENSB are competing with node equalization circuit 206. In this situation, NMOS transistors 256 and 258 are not pulling down on nodes SENS and SENSB because node 244 is high. Since nodes SENS and SENSB have been pulled up, PMOS transistors 260 and 262 in resolving circuit 204 are cut off. Further, since node 242 is high, NMOS transistors 264 and 266 of signal generating circuit 208 pull up node signals 268 and 270 until the voltage between the gates of NMOS transistors 264 and 266 and nodes 268 and 270 drops below a threshold voltage value, thereby turning NMOS transistors 264 and 266 off. The voltage at node 272 from enable circuit 202 is high when node signals 246 and 248 are low and the ENABLE# signal, which is an active low signal, is low. This causes node signals 268 and 270 to be pulled up by NMOS transistors 274 and 276 to within a threshold voltage of the voltage of nodes SENS and SENSB, at which point NMOS transistors 274 and 276 will turn off since their gate to source voltage is below a threshold voltage.

N-MOS transistor 224 and PMOS transistor 222 will turn off when nodes SENS and SENSB are both high, and thus neither transistor 224 or 222 will output node signal 226. The voltage levels of node signals 226 and 234 are maintained by the cross-coupled inverters 228 and 230 of latching circuit 212 and output signal 238 remains constant during this time.

The second phase, the signal differentiation phase, begins when clock input signal 240 switches to high, which drives node signal 242 low. This in turn drives node signals 246 and 248 high. The rise of node signal 248 is delayed relative to the rise of node signal 246 due to the resistive transmission gate that includes NMOS transistor 278 and PMOS transistor 280. The relative delay is further increased by having the switching threshold of inverter 282 skewed high, i.e., the switching threshold of the inverter is a voltage greater than VDD/2. This causes node signal 246 to switch earlier than if inverter 282 were selected to have its switching threshold near the middle of its input swing. Note that node signal 244 switches even one gate delay later than the switching of node signal 248.

When node signal 242 goes low, signal generating circuit 208 produces different voltage levels on nodes SENS and SENSB. Initially, node signal 272 and the signals at nodes SENS and SENSB are all at voltage VDD, and node signals 268 and 270 are both at a threshold voltage below VDD. In this situation, transistors 274 and 276 are both poised to operate in their constant current regions when transistors 264 and 266 first pull node signals 268 and 270 just below a threshold voltage of VDD. As node signal 242 goes low, transistors 264 and 266 pull down node signals 268 and 270 with different drive strengths (i.e., currents), depending on the relative levels of their respective input gate voltages REF and PAD. The difference in the pull down drive strengths causes the voltages on nodes SENS and SENSB to fall at different rates, producing a difference in voltage between nodes SENS and SENSB.

Since the switching threshold of inverter 282 is skewed high, node signal 246 reaches a level high enough to turn off equalization circuit 206 at approximately the same time that node signal 242 gets low enough to allow differential currents in signal generating circuit 208. One advantage of this feature is power savings due to the fact that signal generating circuit 208 is turned on just after equalization circuit 206 turns off, thereby avoiding "crowbar" current. i.e., current flowing directly between the supply and ground by both circuits being simultaneously on. Another advantage is increased signaling frequency attainable using the present invention since the hold-time requirement and the clock Q delay is decreased by enabling signal generating circuit 208 just after equalization circuit 206 is turned off because this prevents a drive fight between signal generating circuit 208 and equalization circuit 206.

Since the voltage at nodes SENS and SENSB fall at different rates, one node will fall a threshold voltage below VDD before the other. Since each of these two nodes is connected in resolving circuit 204 to the gate of the PMOS transistor whose drain is connected to the other node, the node which has fallen a threshold voltage below VDD first will enable the PMOS that pulls up the other node, thereby amplifying the voltage difference between the two nodes. For example, if the voltage on node SENS falls a threshold voltage below VDD before the voltage on node SENSB does so, then transistor 262 will turn on while transistor 260 is still off. Therefore, the falling of the voltage at node SENSB will be slowed or even reversed as transistor 262 begins to pull it up. Since the voltage on node SENS will still be falling, the voltage difference between SENS and SENSB will increase and the drive-strength of transistor 262 will continue increasing, causing the voltage difference to increase even further.

In the meantime, the delay (relative to node signal 242) in the low-going transition of node signal 244 allows signal generating circuit 208 to develop sufficient voltage differential between nodes SENS and SENSB before NMOS transistors 256 and 258 of resolving circuit 204 turn on. This feature assures accurate signal resolution under normal operating conditions. Note that there are many sources of noise in the differential signal between nodes SENS and SENSB such as mismatches in the capacitive loading of the two nodes, and offsets in equalization of the two nodes. If the resolving circuit 204 becomes active too early, the signal generating circuit 208 might not have sufficient time to overcome the noise, and the signal amplified by resolving circuit 204 might have the wrong logic sense.

When node signal 244 eventually goes low, NMOS transistors 256 and 258 are enabled to reinforce the effects of the PMOS transistors 260 and 262 in amplifying the voltage differential that has developed between nodes SENS and SENSB. Each of nodes SENS and SENSB is connected to the gate of the NMOS transistor whose drain is connected to the other node. Therefore, the node that is at a higher voltage will cause the other node to be pulled down more strongly, thereby increasing the voltage difference between them, thereby increasing the difference in the NMOS pull-down strengths. Thus, the difference between the signals on nodes SENS and SENSB is amplified by resolving circuit 204.

The delay in the rise of node signal 248 prevents enable/disable circuit 202 from pulling node 272 low (thereby disabling transistors 274 and 276, which decouples the nodes SENS and SENSB from signal generating circuit 208) until signal generating circuit 208 has had time to develop a voltage differential between nodes SENS and SENSB.

The eventual decoupling of signal generating circuit 208 from the nodes SENS and SENSB by the falling of the node 272 (when the clock signal on node 248 eventually rises) prevents this circuit from interfering with the signal resolving action of resolving circuit 204. In particular, the decoupling of nodes SENS and SENSB prevents signal generating circuit 208 from inhibiting the upward transition of one of nodes SENS and SENSB going high. With signal generating circuit 208 decoupled from the nodes SENS and SENSB, resolving circuit 204 can fully amplify the voltage difference between the nodes SENS and SENSB so that the voltage on one of the nodes approaches VDD and the voltage on the other of the nodes approaches VSS.

When one of the nodes SENS and SENSB goes high and the other goes low, signal conversion circuit 210 enables either transistor 222 or transistor 224. Each transistor is sized large enough to overpower inverter 228 in signal latching circuit 212, if necessary, and therefore determines what value is now on nodes 224 and 226, and thus what value is provided as the output of receiver 200 at node OUT.

When the clock signal again goes low, receiver 200 is returned to the precharge phase of operation.

Receiver circuit 200 includes a plurality of characteristics which enable high frequency signaling and low voltage operation. More specifically, because the signal generation circuit 208 transistors operate in their constant current (i.e., saturation) regions in the early part of the signal differential phase, the signal to noise ratio during this time is larger than it would be if these transistors were to operate in their linear regions. Also, the decoupling of nodes SENS and SENSB from all circuits except signal generating circuit 208 during the early part of the signal differentiation phase allows a differential voltage between these nodes to develop quickly, thereby keeping the hold-time short. Also, there is no direct current coupling between the inputs nodes REF and PAD and the sense nodes SENS and SENSB. This allows the set up time requirement with respect to the clock signal to be zero or less. Also, signal generation circuit 208 is coupled in parallel (as opposed to being connected in series) with the NMOS transistors of resolving circuit 204. This configuration provides a plurality of advantages. More specifically, signal generation circuit 208 produces a voltage differential between nodes SENS and SENSB more quickly than would be possible with a series connection because the net output resistance of the circuits generating the voltage differential is lower in the parallel connection than in the series connection. Thus the currents producing the voltage differential are larger. Fast generation of the voltage differential allows a low clock Q delay for the receiver. Another advantage of this configuration is that receiver 200 can operate even if the power supply voltage level is very low, e.g. little more than a threshold voltage. Since the signal differentiating effects of resolving circuit 204 occur simultaneously with the signal differentiating effects of signal generation circuit 208, the resolution of the differential signal occurs more quickly than if these effects occurred in sequence. This produces a smaller clock to Q delay allowing higher signaling frequencies.

Figure 3:
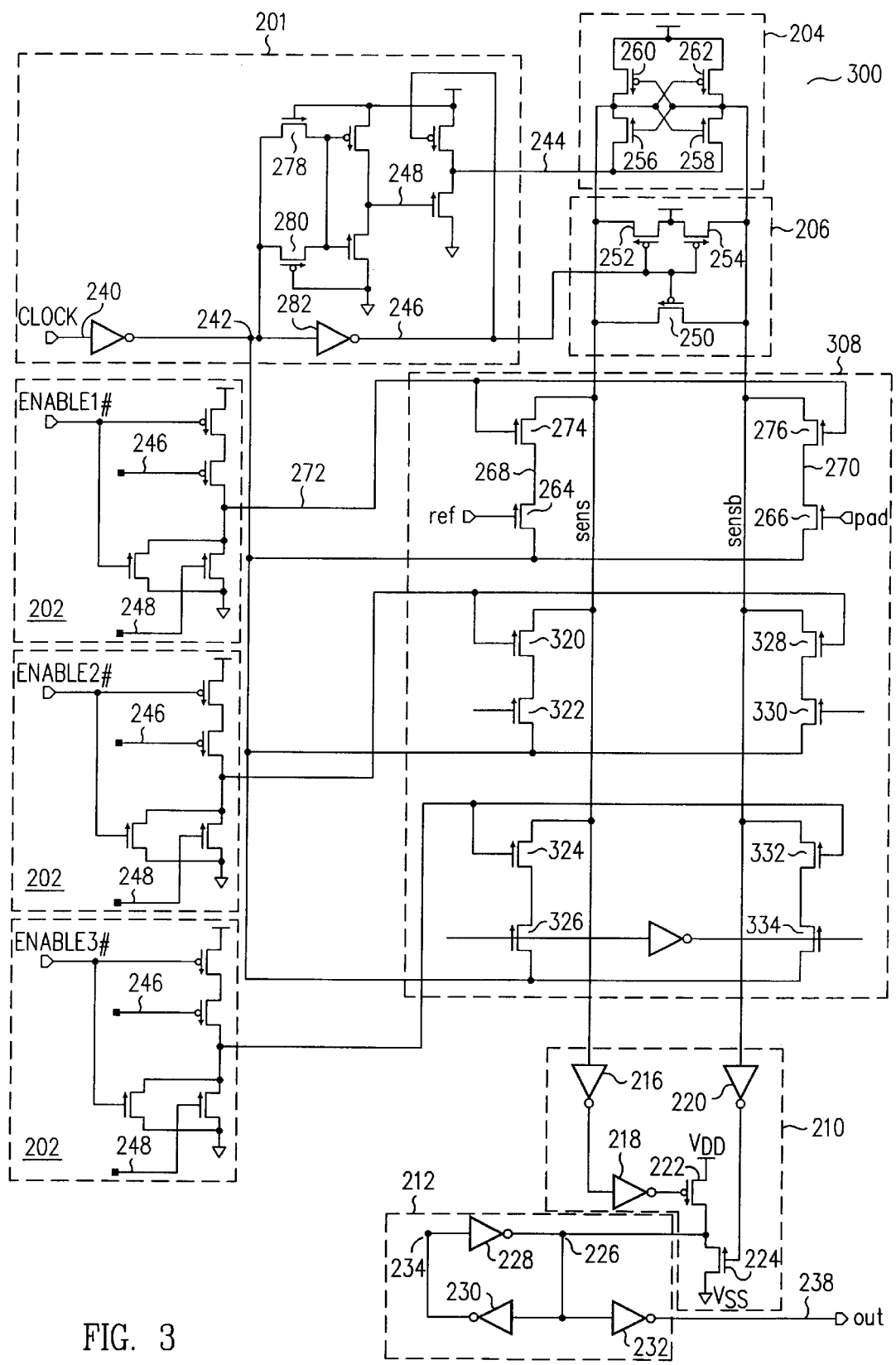
FIG. 3 shows a schematic diagram of a multi-input differential receiver in accordance with the present invention.

Referring to FIG. 3, three input signals may be selectively detected using a receiver 300. More specifically, receiver 300 includes a plurality of enable/disable circuits 302 as well as a signal generation circuit 308 which includes a plurality of parallel signal generation circuits such as those discussed with respect to receiver 200. Each enable/disable circuit 302 receives a respective ENABLE# signal. Which ENABLE# signal is active determines which of the plurality of signal generation circuits is coupled to the nodes SENS and SENSB. Thus, the combination of the plurality of parallel signal generation circuits function as a multiplexer based upon inputs from the plurality of enable/disable circuits 302 where the active ENABLE# signal causes a respective enable/disable circuit 302 to turn on a parallel respective signal generation circuit.

Other Embodiments

Other embodiments are within the following claims.

For example, while two examples have been set forth regarding the number of input signals that may be detected, it will be appreciated that any number of input signals may be individually detected by adjusting the number of enable/disable circuits and the number of parallel signal generation circuits.

Also for example, it will be appreciated that other circuit configurations may be used to provide the latching function of latching circuit 201. Also for example, it will be appreciated that other circuit configurations may be used to provide the equalizing function of equalization circuit 209.

Also for example, while receiver 200 is shown with a polarity such that nodes SENS and SENSB are precharged high, it will be appreciated that a receiver configured to have a polarity such that the nodes SENS and SENSB are precharged low is also within the scope of the invention.

In the present invention, a MOS transistor may be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N-channel MOS device equations merely refers to whichever diffusion (drain or source) has the lower voltage at any given time. For example, the "source" of an N-channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current handling terminal may be arbitrarily deemed the "drain" and the other deemed the "source", with an implicit understanding that the two are not distinct, but interchangeable.

Also, for example, while certain portions of the preferred embodiment are shown as active low circuits and other portions as active high circuits, it will appreciated that the choice of whether a circuit or portion thereof is active low or active high is merely one of design.

What is claimed is:

1. A method for determining the value of a differential input value comprising:
   generating a first current based upon a first part of the differential input value, the first current generating a voltage at a first node;
   generating a second current based upon a second part of the differential input value, the second current generating a voltage at a second node;
   resolving which of the first and second nodes has a higher voltage based upon which of the first and second currents is higher
   reinforcing which of the first and second nodes has a higher voltage during the resolving step by amplifying a differential voltage imposed by the first and second currents at the first and second nodes, so as to enhance the resolving step;
   beginning the reinforcing after the differential voltage is imposed by the first and second currents.

2. The method of claim 1 further comprising:
   equalizing the first and second nodes when a clock signal is not active.

3. The method of claim 1 further comprising:
   isolating the first and second nodes when a clock signal is active.

4. The method of claim 1 further comprising:
   providing an output signal indicative of which of the first and second nodes has a higher voltage; and
   holding the output signal indicating which of the first and second nodes has a higher voltage when a clock signal becomes inactive.

5. A method for determining the value of a differential input value comprising:
   providing a resolving circuit coupled to a clock signal, the resolving circuit having a first threshold voltage at a first and a second node below which a first portion of the resolving circuit turns on and a second threshold voltage at the first and second nodes above which a second portion of the resolving circuit turns on;
   providing a current indicative of a first part of the differential input value to the first node;
   providing a current indicative of a second part of the differential input value to the second node;
   using the clock signal to ground the resolving circuit so as to allow determining the value of the differential input value when the first or second node voltage exceeds the second threshold voltage of the resolving circuit;
   using the clock signal to turn on the second portion of the resolving circuit after the first portion of the resolving circuit is turned on.

6. The method of claim 5 further comprising: using the resolving circuit to resolve which of the first and second nodes has a higher voltage such that the first and second nodes provide a differential result.

7. The method of claim 5 further comprising: equalizing the first and second nodes when the clock signal is not active.

8. The method of claim 6 further comprising:
   providing an output signal indicative of which of the first and second nodes has a higher voltage; and
   holding the output signal indicating which of the first and second nodes has a higher voltage when the clock signal becomes inactive.

9. The method of claim 6 further comprising:
   reinforcing which of the first and second nodes has a higher voltage by amplifying the differential result so as to enhance the resolving of which of the first and second nodes has a higher voltage.

10. The method of claim 9 further comprising:
    reinforcing using a differential voltage imposed by the currents at the first and second nodes.

11. The method of claim 9 wherein:
    the reinforcing occurs during a time after the first or second node voltage exceeds the second threshold voltage of the resolving circuit.

12. The method of claim 11 further comprising: isolating the first and second nodes when the clock signal is active.

13. The method of claim 5 further comprising:
    providing a clock circuit coupled to the resolving circuit.

14. The method of claim 13 further comprising:
    providing a delay during a signal differentiation phase.

15. The method of claim 13 further comprising:
    providing a switching threshold; and
    skewing the switching threshold high.

16. The method of claim 14 further comprising:
    using the switching threshold to turn on a signal generating circuit just after an equalization circuit turns off.

* * * * *